(12) United States Patent
Peng et al.

(10) Patent No.: US 11,178,787 B2
(45) Date of Patent: Nov. 16, 2021

(54) SERVER DEVICE

(71) Applicants: INVENTEC (PUDONG) TECHNOLOGY CORPORATION, Shanghai (CN); INVENTEC CORPORATION, Taipei (TW)

(72) Inventors: Ping-Wei Peng, Taipei (TW); Wen-Long Huang, Shanghai (CN); Xing Liu, Shanghai (CN); Liguo Zhou, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 5 days.

(21) Appl. No.: 16/901,953

(22) Filed: Jun. 15, 2020

(65) Prior Publication Data

US 2021/0298192 A1 Sep. 23, 2021

(30) Foreign Application Priority Data

Mar. 19, 2020 (CN) .......................... 202010198000.2

(51) Int. Cl.
| | |
|---|---|
| *H05K 7/14* | (2006.01) |
| *H05K 7/20* | (2006.01) |
| *H05K 5/03* | (2006.01) |
| *H05K 5/02* | (2006.01) |

(52) U.S. Cl.
CPC ......... *H05K 7/1487* (2013.01); *H05K 5/0247* (2013.01); *H05K 5/0286* (2013.01); *H05K 5/03* (2013.01); *H05K 7/1427* (2013.01); *H05K 7/1491* (2013.01); *H05K 7/20172* (2013.01)

(58) Field of Classification Search
None
See application file for complete search history.

(56) References Cited

U.S. PATENT DOCUMENTS

| | | | |
|---|---|---|---|
| 6,580,603 B1* | 6/2003 | Resnick ................. | G06F 1/184 312/223.1 |
| 9,229,496 B2* | 1/2016 | Cravens ............... | H05K 7/1487 |
| 9,532,480 B2* | 12/2016 | Shen ...................... | G06F 1/184 |
| 9,867,307 B2* | 1/2018 | Kurosaki ............. | H05K 7/1489 |
| 9,955,607 B1* | 4/2018 | Valentine ............ | H05K 7/1488 |
| 2006/0250766 A1* | 11/2006 | Blaalid .................. | G06F 1/187 361/679.33 |

(Continued)

*Primary Examiner* — Xanthia C Cunningham
(74) *Attorney, Agent, or Firm* — Maschoff Brennan

(57) ABSTRACT

A server device includes a case, first, second and third hard disk brackets and a first cable management cover. The case includes a main part and an expansion part disposed on the main part. The first hard disk bracket is fixed to the expansion part. The second and third hard disk brackets are pivotably disposed on the main part. A first cable management space is formed between each of two opposite exterior surfaces of the second hard disk bracket and each of two opposite interior surfaces of the main part. The second hard disk bracket is between the first and third hard disk brackets. A second cable management space is between a bottom surface of the third hard disk bracket and a supporting surface of the main part. A first cable management cover is in one of the first cable management spaces and fixed to the main part.

10 Claims, 9 Drawing Sheets

(56) References Cited

U.S. PATENT DOCUMENTS

| | | | | |
|---|---|---|---|---|
| 2009/0273896 A1* | 11/2009 | Walker | ............ | G06F 1/187 |
| | | | | 361/679.33 |
| 2013/0003317 A1* | 1/2013 | Gong | ............ | H05K 7/1491 |
| | | | | 361/726 |
| 2013/0214658 A1* | 8/2013 | Liang | ............ | H05K 7/1491 |
| | | | | 312/223.2 |
| 2015/0342080 A1* | 11/2015 | Chen | ............ | G11B 33/128 |
| | | | | 361/679.31 |
| 2016/0135322 A1* | 5/2016 | Chen | ............ | G11B 33/142 |
| | | | | 361/679.46 |

* cited by examiner

SERVER DEVICE

CROSS-REFERENCE TO RELATED APPLICATIONS

This non-provisional application claims priority under 35 U.S.C. § 119(a) on Patent Application No(s). 202010198000.2 filed in China on Mar. 19, 2020, the entire contents of which are hereby incorporated by reference.

TECHNICAL FIELD

This disclosure relates to a server device, more particularly to a server device including cable management structure.

BACKGROUND

As the computer technology progresses, desktop computers, laptop computers or other types of portable computer are widely used in daily life. In addition to the advancement of the communication technology, cross-border e-commerce becomes a major trend. Personal computers are not sufficient to process a massive amount of data generated in the global e-commerce market. As a result, a server (e.g., a rack server, a blade server or tower server) is provided.

A rack server is, for example, installed in a server rack, and the server rack may accommodate other rack servers at the same time. The rack server not only occupy a small space of the server rack, but also is easily to be managed. Moreover, the rack server may collaborate with other rack servers in the server rack to improve computing performance or data storage capacity. However, when electronic devices, such as hard disk drives, in the server are arranged compactly, a problem of lacking cable management space may occur because compact arrangement of hard disk drives may reduce the space where cables can be disposed. Therefore, how to maintain the performance of the server while achieving cable management is an important topic to relevant research and development teams.

SUMMARY

The present disclosure is to provide a server device, which is capable of maintaining the performance thereof while achieving cable management.

One embodiment of the disclosure provides a server device. The server device includes a case, a first hard disk bracket, a second hard disk bracket, a third hard disk bracket and at least one first cable management cover. The case includes a main part and an expansion part mounted to one side of the main part. The first hard disk bracket is fixed to the expansion part of the case. The second hard disk bracket is pivotably disposed on the main part of the case. A first cable management space is formed between one of two opposite exterior surfaces of the second hard disk bracket and one of two opposite interior surfaces of the main part of the case, and another first cable management space is formed between the other of the two opposite exterior surfaces of the second hard disk bracket and the other of the two opposite interior surfaces of the main part. The third hard disk bracket is pivotably disposed on the main part of the case. The second hard disk bracket is located between the first hard disk bracket and the third hard disk bracket, and at least one second cable management space is formed between a bottom surface of the third hard disk bracket and a supporting surface of the main part of the case. The at least one first cable management cover is located in one of the two first cable management spaces and fixed to the main part of the case.

One embodiment of the disclosure provides a server device. The server device includes a case, a first hard disk bracket, a second hard disk bracket and at least one first cable management cover. The first hard disk bracket is fixed to the case. The second hard disk bracket is pivotably disposed on the case. A first cable management space is formed between one of two opposite exterior surfaces of the second hard disk bracket and one of two opposite interior surfaces of the case, and another first cable management space is formed between the other of the two opposite exterior surfaces of the second hard disk bracket and the other of the two opposite interior surfaces of the case. At least one second cable management space is formed between a bottom surface of the second hard disk bracket and a supporting surface of the case. The at least one first cable management cover is located in one of the two first cable management spaces and fixed to the case.

According to the server device as described above, the cable management spaces for cables to be disposed therein are provided on opposite sides or under the second hard disk bracket or the third hard disk bracket so as to maintain the performance of the server while achieving easy cable management.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
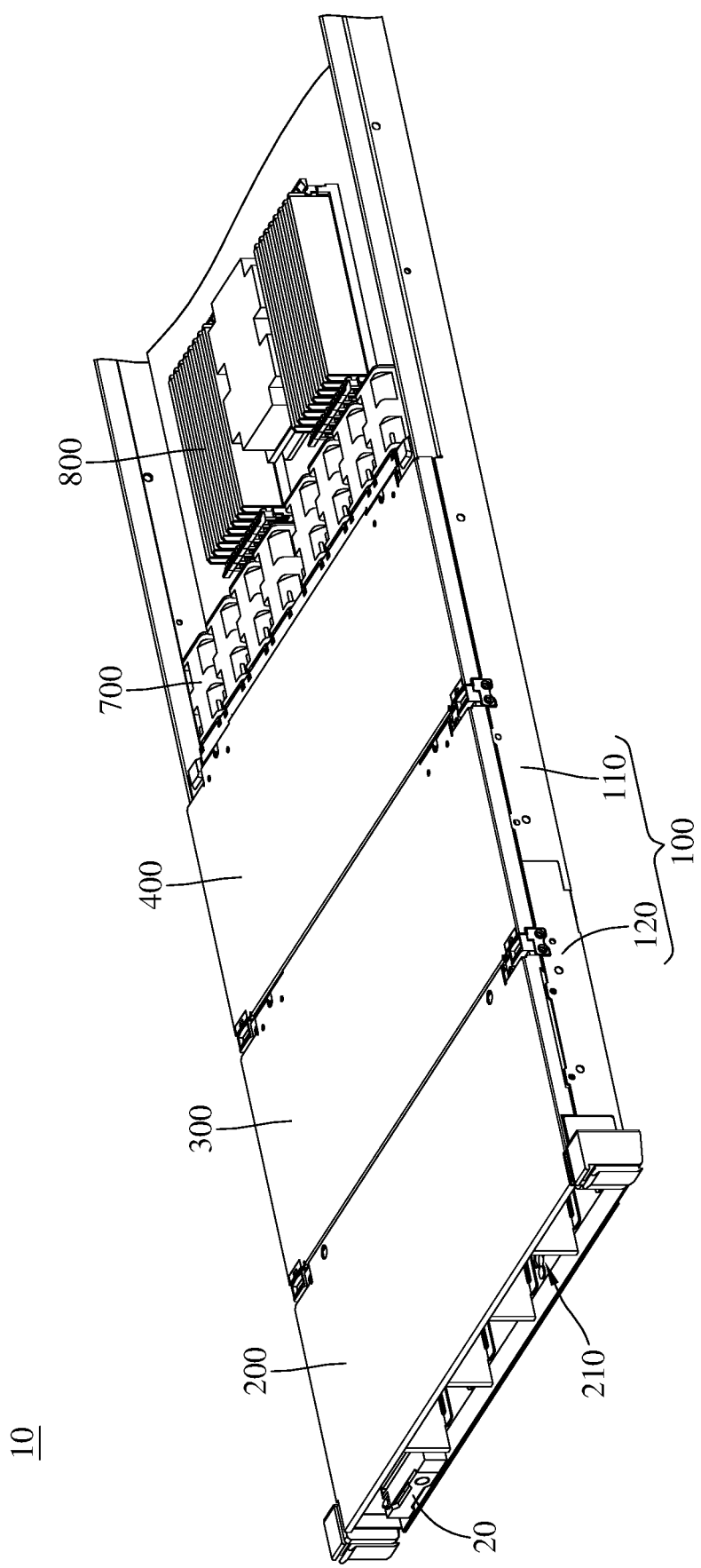
FIG. 1 is a perspective view of a server device in accordance with the first embodiment of the disclosure.
Figure 2:
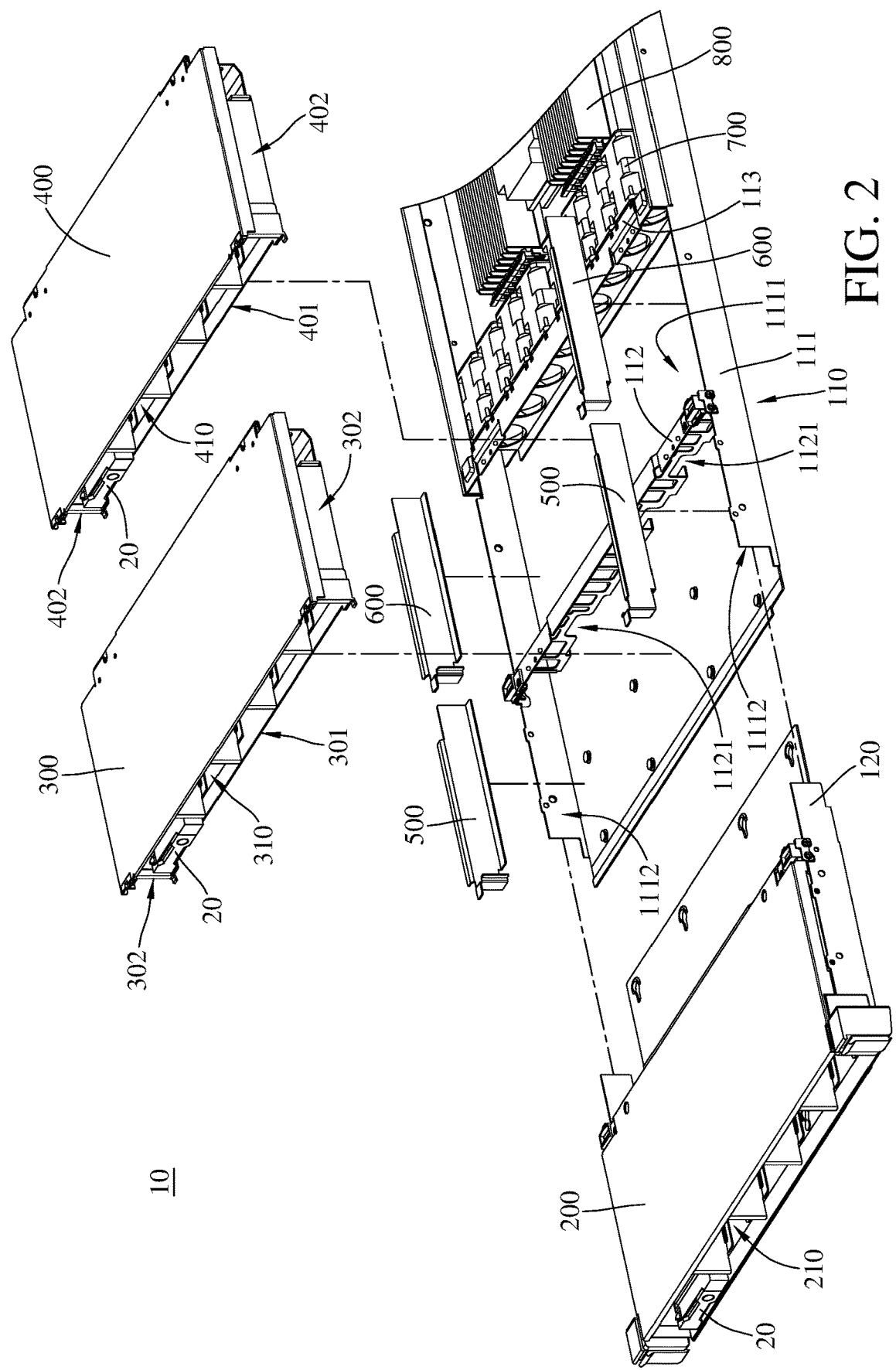
FIG. 2 is an exploded view of the server device in FIG. 1.
Figure 3:
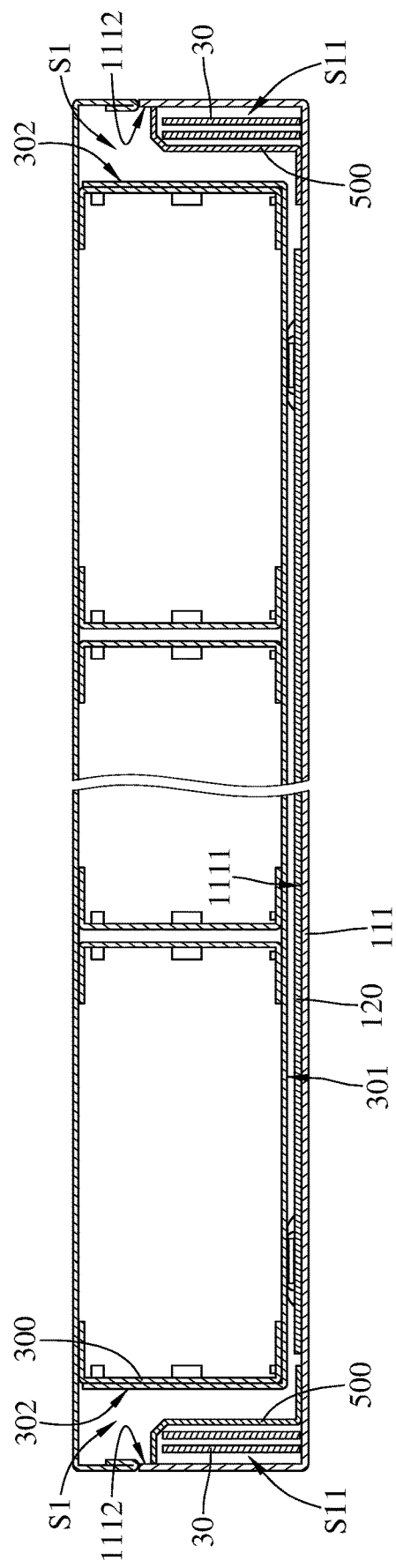
FIG. 3 is a cross-sectional view of the server device in FIG. 1.

Please refer to FIG. 1 to FIG. 3. FIG. 1 is a perspective view of a server device in accordance with the first embodiment of the disclosure, FIG. 2 is an exploded view of the server device in FIG. 1, and FIG. 3 is a cross-sectional view of the server device in FIG. 1.

In this embodiment, a server device 10 is provided. The server device 10 includes a case 100, a first hard disk bracket 200, a second hard disk bracket 300, a third hard disk bracket 400, and two first cable management covers 500. In this embodiment, the server device 10 may, for example, further include two second cable management covers 600. The case 100 includes a main part 110 and an expansion part 120. The expansion part 120 is detachably mounted to one side of the main part 110. In this embodiment, the expansion part 120 can, for example, be quickly mounted or removed from the main part 110 by the cooperation of pear-shaped holes and engagement pins respectively provided thereon.

The main part 110 includes an accommodation portion 111, a first partition part 112, and a second partition part 113. The accommodation portion 111 has a supporting surface 1111. The supporting surface 1111 is configured to support objects. The first partition part 112 and the second partition part 113 stand on the supporting surface 1111 of the accommodation portion 111, and they are spaced apart from each other.

The first hard disk bracket 200 is located on one side of the first partition part 112 located away from the second partition part 113, and the first hard disk bracket 200 is fixed to the expansion part 120 of the case 100. The first hard disk bracket 200 has a plurality of first installation openings 210 exposed to the outside. Users may, for example, insert hard disk drives 20 into the first hard disk bracket 200 through the first installation openings 210 or remove the hard disk drives 20 from the first hard disk bracket 200 through the first installation openings 210.

The second hard disk bracket 300 is located on one side of the first partition part 112 located away from the second partition part 113, and the second hard disk bracket 300 is located between the first hard disk bracket 200 and the first partition part 112. The second hard disk bracket 300 is pivotably disposed on the main part 110 of the case 100. The second hard disk bracket 300 has a plurality of second installation openings 310, and the second hard disk bracket 300 is pivotable relative to the main part 110 of the case 100 to expose or conceal the second installation openings 310. When the second installation openings 310 of the second hard disk bracket 300 are exposed to the outside, users may, for example, insert the hard disk drives 20 into the second hard disk bracket 300 through the second installation openings 310 or remove the hard disk drives 20 from the second hard disk bracket 300 through the second installation openings 310.

In addition, a part of the expansion part 120 is located between a bottom surface 301 of the second hard disk bracket 300 and the supporting surface 1111 of the main part 110. There is a first cable management space S1 formed between one of two opposite exterior surfaces 302 of the second hard disk bracket 300 and one of two opposite interior surfaces 1112 of the main part 110 of the case 100, and there is another first cable management space S1 formed between the other of the two opposite exterior surfaces 302 and the other of the two opposite interior surfaces 1112.

The third hard disk bracket 400 is located between the first partition part 112 and the second partition part 113, and the third hard disk bracket 400 is pivotably disposed on the main part 110 of the case 100. That is, the second hard disk bracket 300 is located between the first hard disk bracket 200 and the third hard disk bracket 400. The third hard disk bracket 400 has a plurality of third installation openings 410, and the third hard disk bracket 400 is pivotable relative to the main part 110 of the case 100 to expose or conceal the third installation openings 410. When the third installation openings 410 of the third hard disk bracket 400 are exposed to the outside, users may, for example, insert the hard disk drives 20 into the third hard disk bracket 400 through the third installation openings 410 or remove the hard disk drives 20 from the third hard disk bracket 400 through the third installation openings 410.

Figure 4:
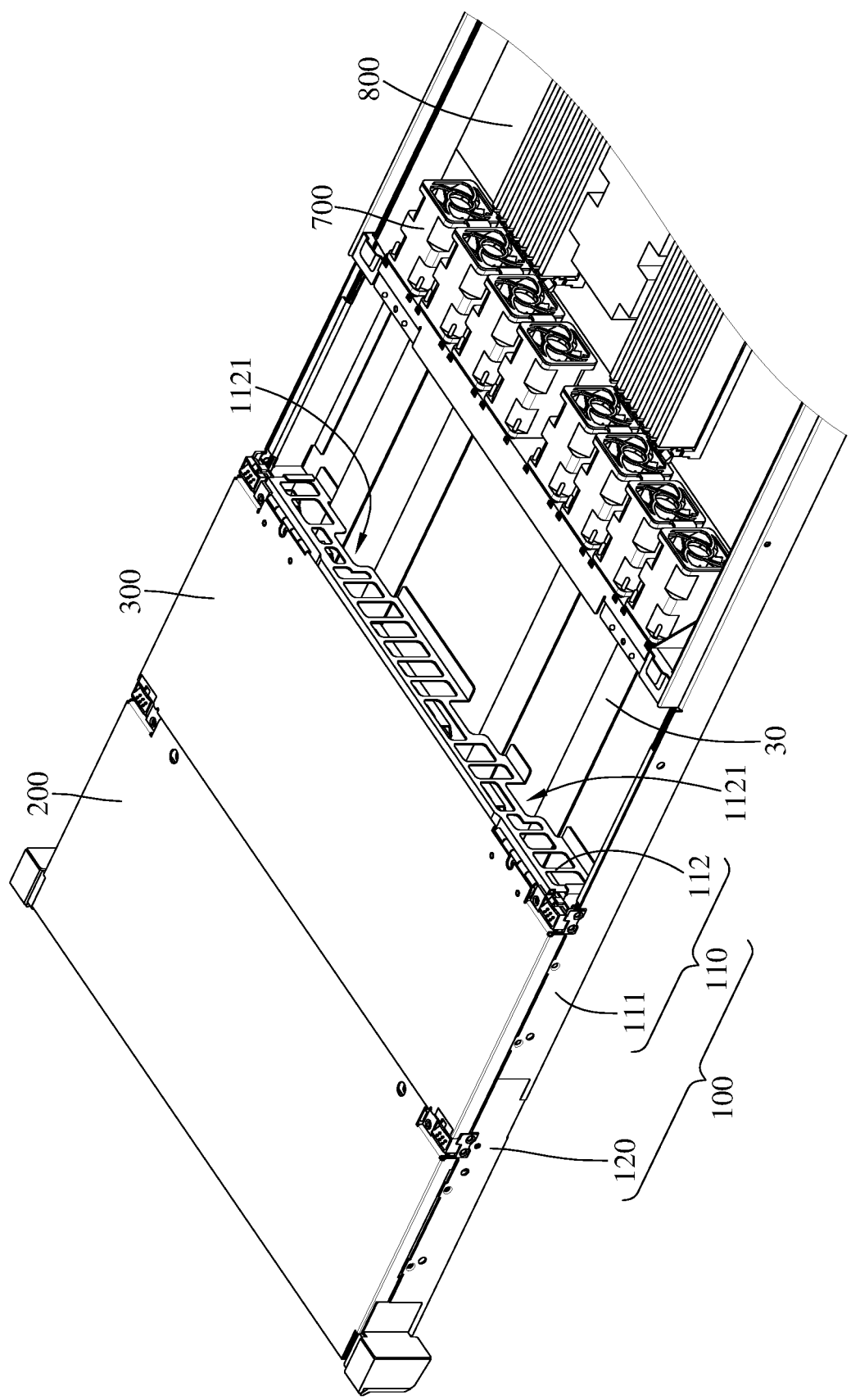
FIG. 4 is a partial perspective view of the server device in FIG. 1.
Figure 5:
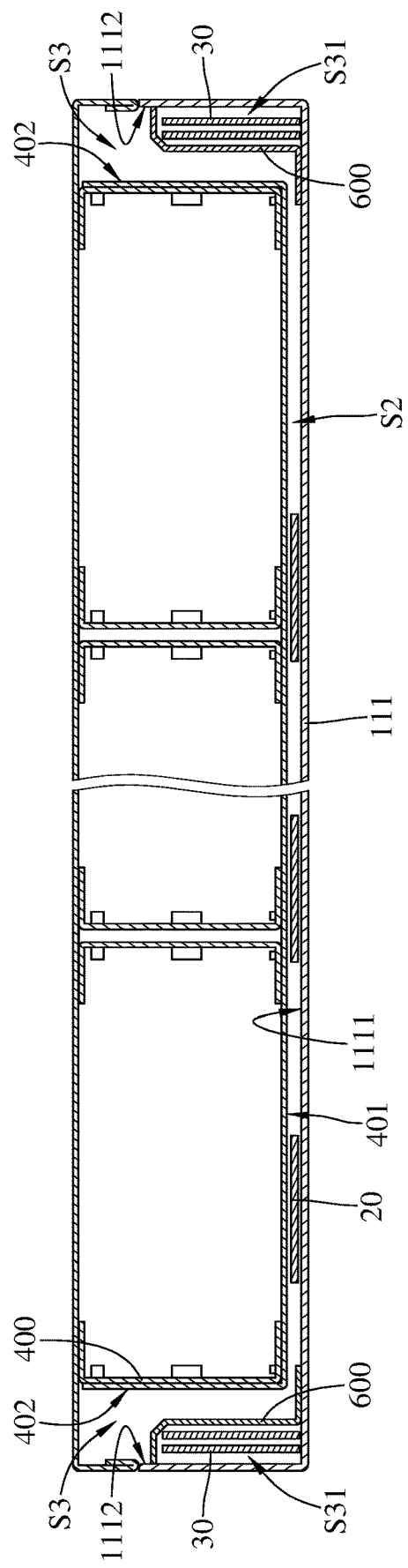
FIG. 5 is another cross-sectional view of the server device in FIG. 1.

Please refer to FIG. 4 and FIG. 5. FIG. 4 is a partial perspective view of the server device in FIG. 1, and FIG. 5 is another cross-sectional view of the server device in FIG. 1. In this embodiment, there is at least one second cable management space S2 formed between a bottom surface 401 of the third hard disk bracket 400 and the supporting surface 1111 of the main part 110 of the case 100. There is at least one third cable management space S3 formed between one of two opposite exterior surfaces 402 of the third hard disk bracket 400 and one of the two opposite interior surfaces 1112 of the case 100, and there is at least one another third cable management space S3 formed between the other of the two opposite exterior surfaces 402 and the other of the two opposite interior surfaces 1112.

The two first cable management covers 500 are respectively located in the two first cable management spaces S1 and fixed to the main part 110 of the case 100. One of the two first cable management covers 500 and one of the two opposite interior surfaces 1112 of the main part 110 together surround a first channel S11, and the other of the two first cable management covers 500 and the other of the two opposite interior surfaces 1112 together surround another first channel S11. The first channels S11 are configured for cables 30 to be disposed therein. The cables 30 located in the first channels S11 can be covered and thus protected by the first cable management covers 500, such that the cables 30 do not tangle with the second hard disk bracket 300 as the second hard disk bracket 300 is pivoted relative to the main part 110. Therefore, the first cable management covers 500 can provide rooms to accommodate the cables 30, and prevent the cables 30 from interfering the movement of the second hard disk bracket 300, thereby providing a smooth movement of the second hard disk bracket 300.

The two second cable management covers 600 are respectively located in the two third cable management spaces S3 and fixed to the main part 110 of the case 100. One of the two second cable management covers 600 and one of the two opposite interior surfaces 1112 of the main part 110 together surround a second channel S31, and the other of the two second cable management covers 600 and the other of the two opposite interior surfaces 1112 together surround another second channel S31. The second channels S31 are configured for the cables 30 to be disposed therein. The cables 30 located in the second channel S31 is covered and thus protected by the second cable management covers 600, such that the cables 30 do not tangle with the third hard disk bracket 400 as the third hard disk bracket 400 is pivoted relative to the main part 110. Therefore, the second cable management covers 600 can provide rooms to accommodate the cables 30, and prevent the cables 30 from interfering the movement of the third hard disk bracket 400, thereby providing a smooth movement of the third hard disk bracket 400.

Figure 6:
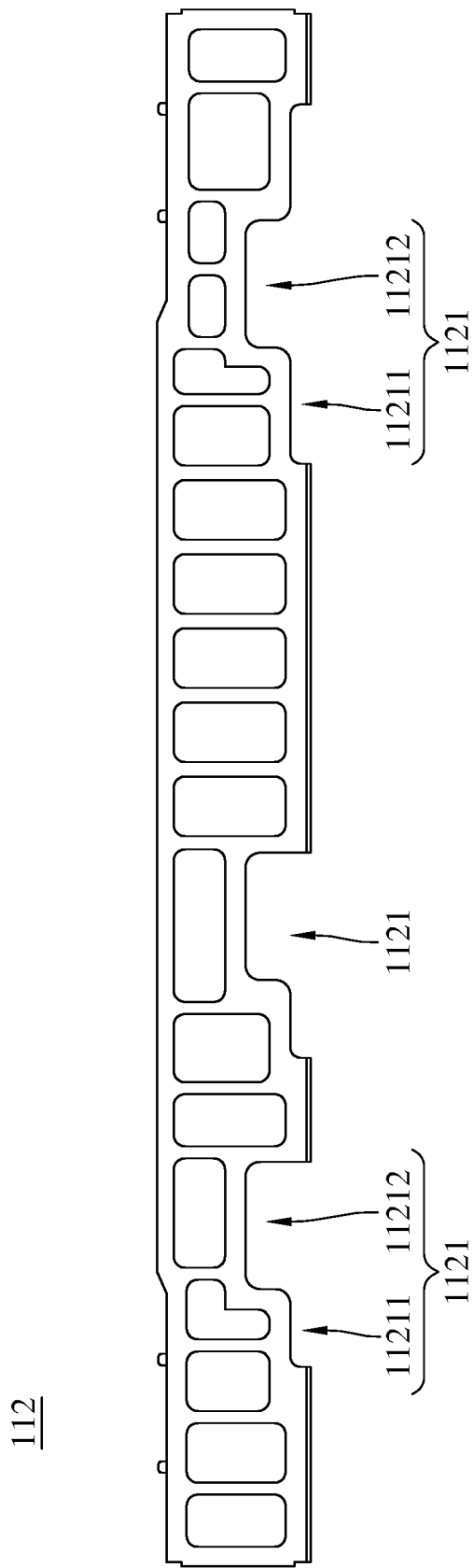
FIG. 6 is a planar view of a first partition part of the server device in FIG. 2.

Please refer to FIG. 6, which is a planar view of a first partition part of the server device in FIG. 2. In this embodiment, the first partition part 112 has a plurality of through holes 1121, and at least one of the through holes 1121 has a wide part 11211 and a narrow part 11212 connected to each other. The wide part 11211 is located closer to the supporting surface 1111 of the case 100 than the narrow part 11212 is to the supporting surface 1111 of the case 100. Users may move the cables 30 to one side of the wide part 11211, such that the cables 30 are pressed by the first partition part 112, thereby positioning and arranging the cables 30.

Please refer to FIG. 1 and FIG. 2 again. In this embodiment, the server device 10 may include, for example, a fan assembly 700 and a host assembly 800. The fan assembly 700 is located between the third hard disk bracket 400 and the host assembly 800.

Please refer to FIG. 3 again. In this embodiment, since a part of the expansion part 120 is located between the bottom surface 301 of the second hard disk bracket 300 and the supporting surface 1111 of the main part 110, there is no sufficient room between the bottom surface 301 of the second hard disk bracket 300 and the supporting surface 1111 of the main part 110 for cable management. Thus, in this embodiment, the first cable management spaces S1 on two opposite sides of the second hard disk bracket 300 of the server device 10 are provided for cable management. That is, the cables 30 for electrical connection between the hard disk drives 20 in the first hard disk bracket 200 and the host assembly 800 can pass through the first cable management spaces S1 on opposite sides of the second hard disk bracket 300.

Please refer to FIG. 4 and FIG. 5. Since the expansion part 120 is not located between the bottom surface 401 of the third hard disk bracket 400 and the carrying surface 1111 of the main part 110, there is a sufficient room between the bottom surface 401 of the third hard disk bracket 400 and the supporting surface 1111 of the main part 110 for cable management. Therefore, in this embodiment, besides the third cable management spaces S3 on opposite sides of the third hard disk bracket 400 of the server device 10, the second cable management space S2 located between the bottom surface 401 of the third hard disk bracket 400 and the supporting surface 1111 of the main part 110 can also be provided for cable management. That is, the cables 30 for electrical connection between the hard disk drives 20 in the first hard disk bracket 200 and the host assembly 800, and the cables 30 for electrical connection between the hard disk drives 20 in the second hard disk bracket 300 and the host assembly 800 can pass through the third cable management spaces S3 on opposite sides of the third hard disk bracket 400 or through the second cable management space S2 under the third hard disk bracket 400.

In the above embodiment, the quantity of the first cable management covers 500 is two, and the quantity of the second cable management covers 600 is two, but the present disclosure is not limited thereto. In some other embodiments, the quantity of the first cable management cover may be one, and the quantity of the second cable management cover may be one. In such configuration, the first and second cable management covers are each located in one of the cable management spaces on the sides of the hard disk brackets.

Figure 7:
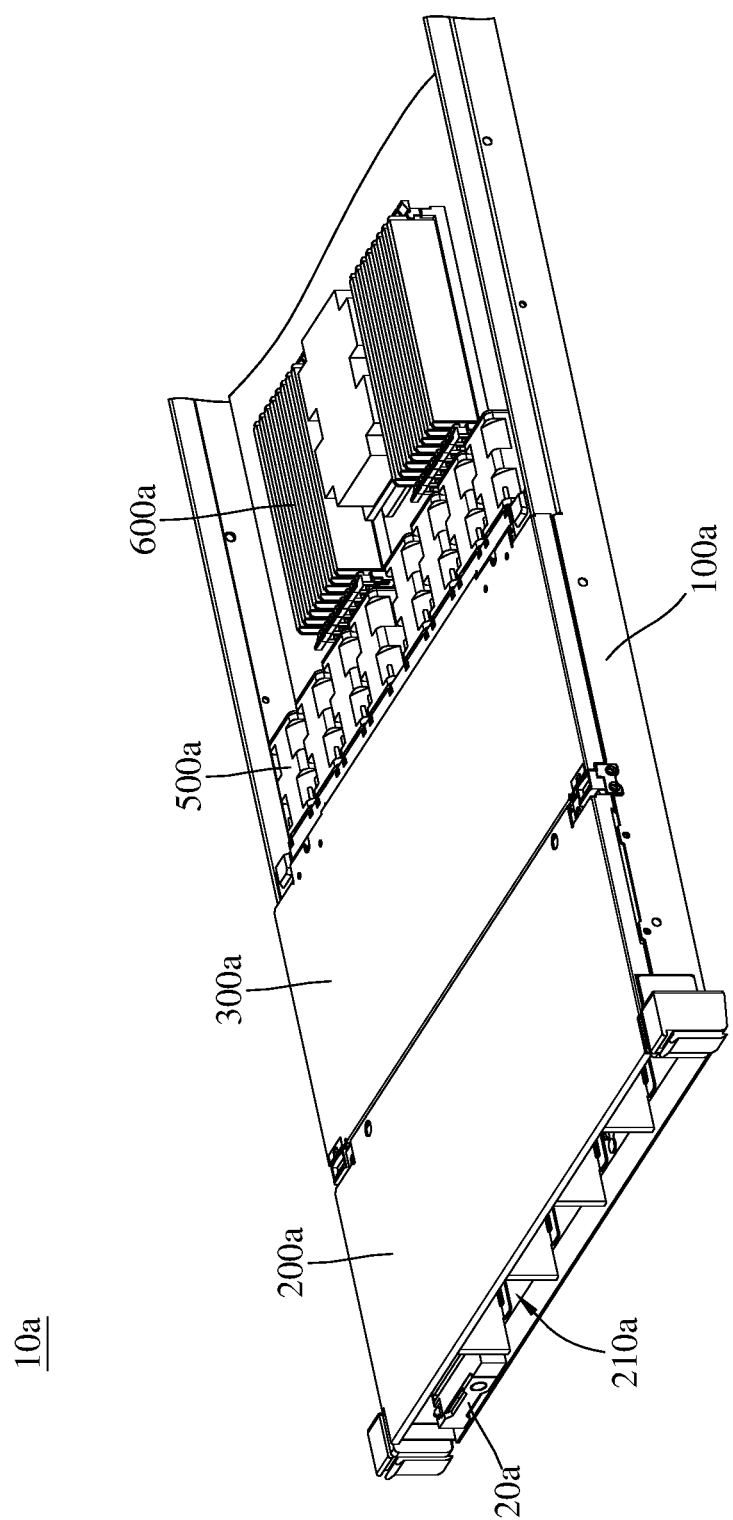
FIG. 7 is a perspective view of a server device in accordance with the second embodiment of the disclosure.
Figure 8:
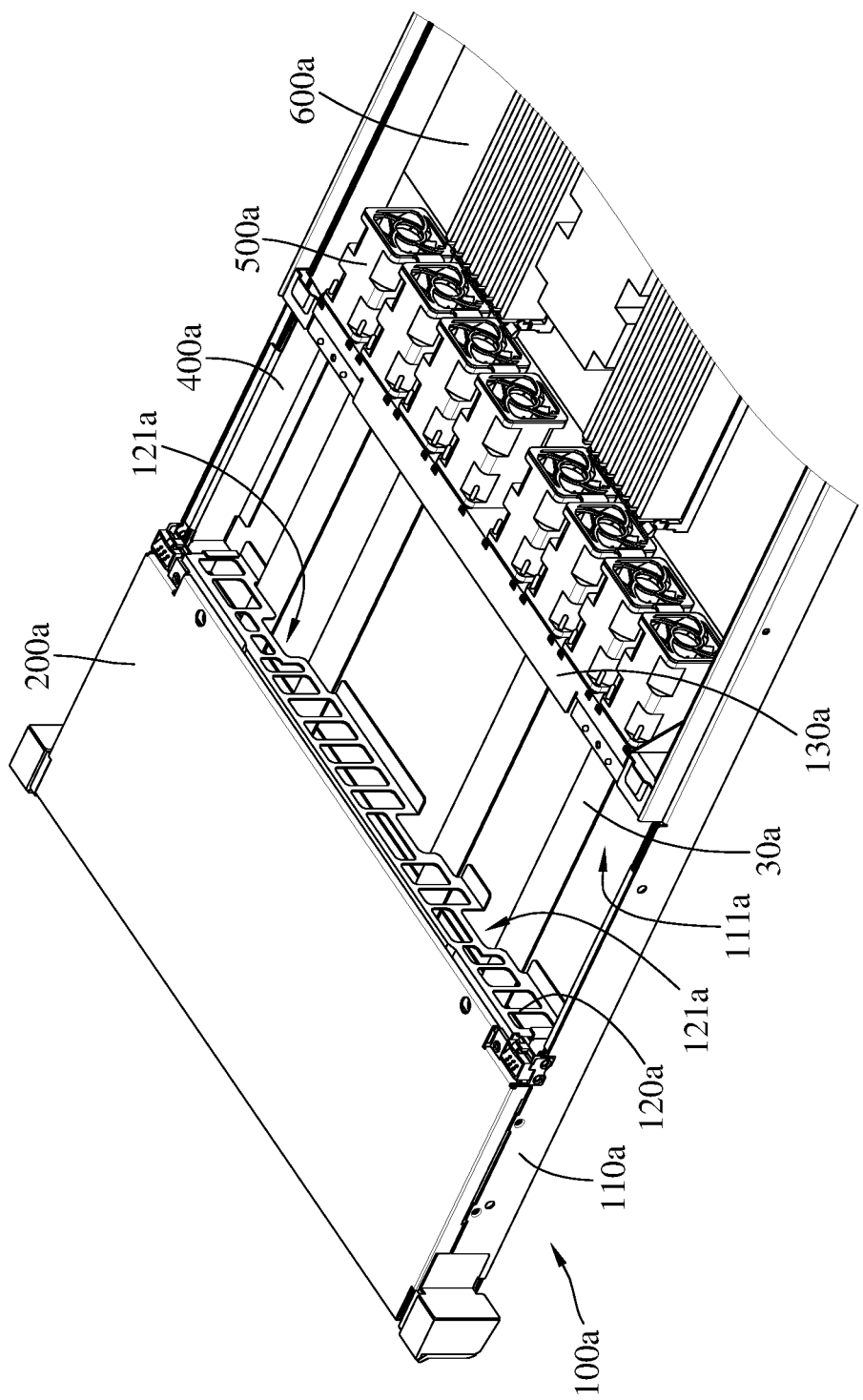
FIG. 8 is a partial perspective view of the server device in FIG. 7.
Figure 9:
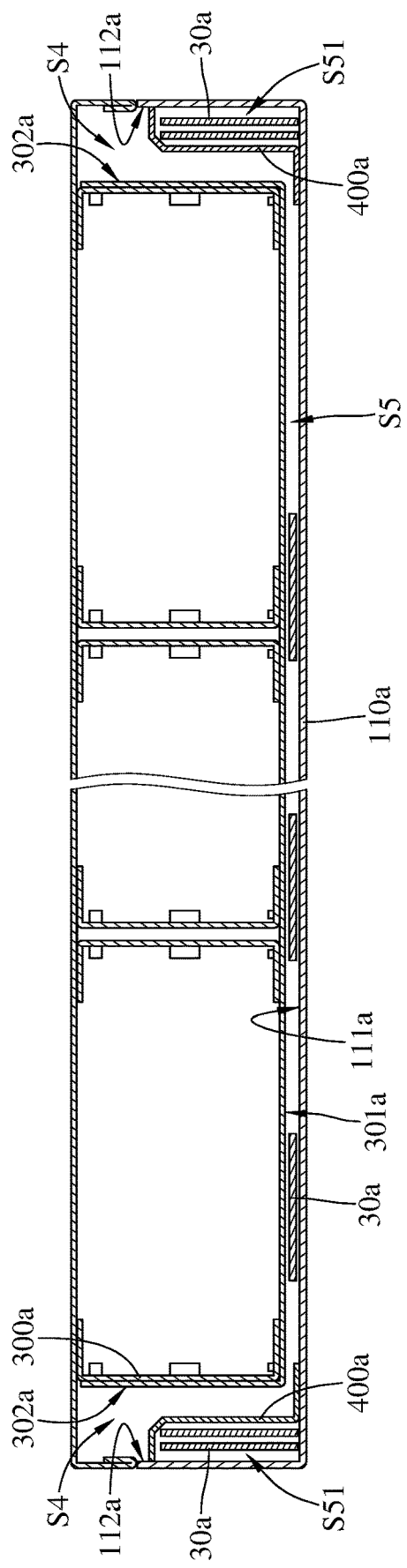
FIG. 9 is a cross-sectional view of the server device in FIG. 7.

Please refer to FIG. 7 to FIG. 9. FIG. 7 is a perspective view of a server device in accordance with the second embodiment of the disclosure, FIG. 8 is a partial perspective view of the server device in FIG. 7, and FIG. 9 is a cross-sectional view of the server device in FIG. 7.

In this embodiment, a server device 10a is provided. The server device 10a includes a case 100a, a first hard disk bracket 200a, a second hard disk bracket 300a and two first cable management covers 400a.

The case 100a includes an accommodation portion 110a, a first partition part 120a, and a second partition part 130a. The accommodation portion 110a has a supporting surface 111a. The supporting surface 111a is configured to support objects. The first partition part 120a and the second partition part 130a stand on the supporting surface 111a of the accommodation portion 110a, and they are spaced apart from each other.

The first hard disk bracket 200a is located on one side of the first partition part 120a located away from the second partition part 130a, and the first hard disk bracket 200a is fixed to the accommodation portion 110a of the case 100a. The first hard disk bracket 200a has a plurality of first installation openings 210a exposed to the outside. Users may, for example, insert hard disk drives 20a into the first hard disk bracket 200a through the first installation openings 210a or remove the hard disk drives 20a from the first hard disk bracket 200a through the first installation openings 210a.

The second hard disk bracket 300a is located between the first partition part 120a and the second partition part 130a, and the second hard disk bracket 300a is pivotably disposed on the accommodation portion 110a of the case 100a. The second hard disk bracket 300a has a plurality of second installation openings, and the second hard disk bracket 300a is pivotable relative to the accommodation portion 110a of the case 100a to expose or conceal the second installation openings. When the second installation openings of the second hard disk bracket 300a are exposed to the outside, users may, for example, insert the hard disk drives 20a into the second hard disk bracket 300a through the second installation openings or remove the hard disk drives 20a from the second hard disk bracket 300a through the second installation openings.

As shown in FIG. 9, in this embodiment, there is at least one first cable management space S4 formed between one of two opposite exterior surfaces 302a of the second hard disk bracket 300a and one of two opposite interior surfaces 112a of the accommodation portion 110a, and there is at least one another first cable management space S4 formed between the other of the two opposite exterior surfaces 302a and the other of the two opposite interior surfaces 112a. There is at least one second cable management space S5 formed between a bottom surface 301a of the second hard disk bracket 300a and a supporting surface 111a of the accommodation portion 110a. The two first cable management covers 400a are respectively located in the two first cable management spaces S4 and fixed to the accommodation portion 110a of the case 100a. One of the two first cable management covers 400a and one of the two opposite interior surfaces 112a of the accommodation portion 110a together surround a first channel S51, and the other of the two first cable management covers 400a and the other of the two opposite interior surfaces 112a together surround another first channel S51. The first channels S51 are configured for cables 30a to be disposed therein. The cables 30a located in the first channel S51 is covered and protected by the first cable management covers 400a, such that the cables 30a do not tangle with the second hard disk bracket 300a as the second hard disk bracket 300a is pivoted relative to the accommodation portion 110a. Therefore, the first cable management covers 400a can provide rooms to accommodate the cables 30a, and prevent the cables 30a from interfering the movement of the second hard disk bracket 300a, thereby providing a smooth movement of the second hard disk bracket 300a.

Please refer to FIG. 7 and FIG. 8 again. In this embodiment, the server device 10a may, for example, includes a fan assembly 500a and a host assembly 600a. The fan assembly 500a is located between the second hard disk bracket 300a and the host assembly 600a.

According to the server device as described above, the cable management spaces for cables to be disposed therein are provided on opposite sides or under the second hard disk bracket or the third hard disk bracket so as to maintain the performance of the server while achieving cable management.

Furthermore, the cable management covers are provided in the cable management spaces and fixed to the case so as to form channels. As such, the cables in the channels are covered and thus protected by the cable management covers, such that the cables do not tangle with the second hard disk bracket as the second hard disk bracket is pivoted relative to the case. Therefore, cable management covers can provide rooms to accommodate the cables, and prevent the cables from interfering the movement of the second hard disk bracket, thereby providing a smooth movement of the second hard disk bracket.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A server device, comprising:
    a case, comprising a main part and an expansion part, the expansion part mounted to one side of the main part;
    a first hard disk bracket, fixed to the expansion part of the case;
    a second hard disk bracket, pivotably disposed on the main part of the case, wherein a first cable management space is formed between one of two opposite exterior surfaces of the second hard disk bracket and one of two opposite interior surfaces of the main part of the case, and another first cable management space is formed between the other of the two opposite exterior surfaces of the second hard disk bracket and the other of the two opposite interior surfaces of the main part;
    a third hard disk bracket, pivotably disposed on the main part of the case, wherein the second hard disk bracket is located between the first hard disk bracket and the third hard disk bracket, and at least one second cable management space is formed between a bottom surface of the third hard disk bracket and a supporting surface of the main part of the case; and
    at least one first cable management cover, located in one of the two first cable management spaces and fixed to the main part of the case.

2. The server device according to claim 1, wherein the quantity of the at least one first cable management cover is two, the two first cable management covers are respectively located in the two first cable management spaces.

3. The server device according to claim 2, wherein one of the two first cable management covers and one of the two opposite interior surfaces of the main part together surround a first channel, and the other of the two first cable management covers and the other of the two opposite interior surfaces of the main part together surround another first channel.

4. The server device according to claim 1, further comprising at least one second cable management cover, wherein at least one third cable management space is formed between one of two opposite exterior surfaces of the third hard disk bracket and one of the two opposite interior surfaces of the main part of the case, at least one another third cable management space is formed between the other of the two opposite exterior surfaces of the third hard disk bracket and the other of the two opposite interior surfaces of the main part of the case, and the at least one second cable management cover is located in one of the third cable management spaces and fixed to the case.

5. The server device according to claim 4, wherein the quantity of the at least one second cable management cover is two, the two second cable management covers are respectively located in the third cable management spaces, one of the two second cable management covers and one of the two opposite interior surfaces of the main part together surround a second channel, and the other of the two second cable management covers and the other of the two opposite interior surfaces of the main part together surround another second channel.

6. The server device according to claim 1, wherein the main part has a partition part, the partition part is located between the second hard disk bracket and the third hard disk bracket, the partition part has at least one through hole, the at least one through hole has a wide part and a narrow part connected to each other, and the wide part is located closer to the supporting surface of the case than the narrow part is to the supporting surface of the case.

7. The server device according to claim 1, wherein a part of the expansion part is located between a bottom surface of the second hard disk bracket and the supporting surface of the main part.

8. The server device according to claim 1, further comprising a host assembly and a fan assembly, wherein the fan assembly is located between the third hard disk bracket and the host assembly.

9. A server device, comprising:
    a case;
    a first hard disk bracket, fixed to the case;
    a second hard disk bracket, pivotably disposed on the case, wherein a first cable management space is formed between one of two opposite exterior surfaces of the second hard disk bracket and one of two opposite interior surfaces of the case, another first cable management space is formed between the other of the two opposite exterior surfaces of the second hard disk bracket and the other of the two opposite interior surfaces of the case, and at least one second cable management space is formed between a bottom surface of the second hard disk bracket and a supporting surface of the case; and
    at least one first cable management cover, located in one of the two first cable management spaces and fixed to the case.

10. The server device according to claim 9, wherein the case has a partition part, the partition part is located between the first hard disk bracket and the second hard disk bracket, the partition part has at least one through hole, the at least one through hole has a wide part and a narrow part connected to each other, and the wide part is located closer to the supporting surface of the case than the narrow part is to the supporting surface of the case.

* * * * *